United States Patent
Ohnishi et al.

(10) Patent No.: US 8,379,686 B2
(45) Date of Patent: Feb. 19, 2013

(54) TWO-DIMENSIONAL PHOTONIC CRYSTAL SURFACE-EMITTING LASER LIGHT SOURCE

(75) Inventors: Dai Ohnishi, Otsu (JP); Wataru Kunishi, Kyoto (JP); Eiji Miyai, Kyoto (JP); Susumu Noda, Uji (JP)

(73) Assignees: Kyoto University, Kyoto (JP); Rohm Co., Ltd., Kyoto (JP)

( * ) Notice: Subject to any disclaimer, the term of this patent is extended or adjusted under 35 U.S.C. 154(b) by 423 days.

(21) Appl. No.: 11/991,097

(22) PCT Filed: Aug. 28, 2006

(86) PCT No.: PCT/JP2006/316866
§ 371 (c)(1), (2), (4) Date: Apr. 4, 2008

(87) PCT Pub. No.: WO2007/029538
PCT Pub. Date: Mar. 15, 2007

(65) Prior Publication Data
US 2009/0279579 A1 Nov. 12, 2009

(30) Foreign Application Priority Data

Sep. 2, 2005 (JP) .................................. 2005-255638
Mar. 20, 2006 (JP) .................................. 2006-077471

(51) Int. Cl.
*H01S 3/08* (2006.01)
(52) U.S. Cl. ........................................ 372/99; 372/50.11
(58) Field of Classification Search .................... 372/99, 372/50.11
See application file for complete search history.

(56) References Cited

U.S. PATENT DOCUMENTS

| 5,164,949 A * | 11/1992 | Ackley et al. .............. 372/45.01 |
| 5,837,561 A | 11/1998 | Kish, Jr. et al. |
| 6,404,797 B1 | 6/2002 | Mooradian |
| 2002/0177246 A1 | 11/2002 | Hang et al. |

(Continued)

FOREIGN PATENT DOCUMENTS

| JP | A-61-284975 | 12/1986 |
| JP | A-03-020090 | 1/1991 |

(Continued)

OTHER PUBLICATIONS

Ohnishi et al., "Continuous wave operation of surface emitting two-dimensional photonic crystal layer," *Electronics Letters*, Apr. 3, 2003, vol. 39, No. 7.

(Continued)

Primary Examiner — Tod T Van Roy
(74) Attorney, Agent, or Firm — Oliff & Berridge, PLC

(57) ABSTRACT

A two-dimensional photonic crystal surface-emitting laser light source producing a beam without side lobes is provided. A window-shaped electrode having a central window devoid of the electrode material is provided on a device substrate. A mount surface electrode smaller than the electrode including the window is provided on a mount surface. The distance between the substrate and the active layer is larger than that between the mount surface and the active layer. When a voltage is applied, electric charges are injected into the active layer and emission is obtained. Light having a specific wavelength is amplified by a two-dimensional photonic crystal and extracted through the window without side lobes due to interference. The positioning of the active layer close to the mount surface significantly enhances the heat-radiating effect.

7 Claims, 6 Drawing Sheets

U.S. PATENT DOCUMENTS

2004/0091010 A1    5/2004  Choquette et al.
2004/0233962 A1*  11/2004  Reid ............................... 372/75
2007/0030873 A1*   2/2007  Deng ......................... 372/50.11

FOREIGN PATENT DOCUMENTS

| JP | A-9-172229    | 6/1997  |
| JP | A-2000-332351 | 11/2000 |
| JP | A-2001-502119 | 2/2001  |
| JP | A-2001-097800 | 4/2001  |
| JP | A-2003-273456 | 9/2003  |
| JP | A-2004-296538 | 10/2004 |
| JP | A-2005-353623 | 12/2005 |

OTHER PUBLICATIONS

European Office Action issued in Application No. EP 06 783 095.0 dated Dec. 12, 2011.

Miyai, Eiji et al., "Lasing Band-Edge Identification for a Surface-Emitting Photonic Crystal Laser," IEEE Journal on Selected Areas in Communications, Jul. 1, 2005, pp. 1335-1340, vol. 23, No. 7, IEEE Service Center, Piscataway, US.

Mar. 29, 2011 European Search Report issued in European Patent Application No. 06 78 3095.

* cited by examiner

TWO-DIMENSIONAL PHOTONIC CRYSTAL SURFACE-EMITTING LASER LIGHT SOURCE

TECHNICAL FIELD

The present invention relates to a surface-emitting laser light source including a flat light source from which laser light is emitted in the direction perpendicular to the flat surface.

BACKGROUND ART

Conventional laser light sources include a Fabry-Perot laser light source, which uses a Fabry-Perot resonator, and a distributed feedback (DFB) laser light source, which uses a diffraction grating. These types of laser light sources produce an oscillation of laser light by amplifying light of a predetermined wavelength through resonation or diffraction.

In recent years, new types of laser light sources using a photonic crystal have been developed. A photonic crystal consists of a dielectric body material in which an artificial periodic structure is created. Usually, the periodic structure is created by providing the body material with a periodic arrangement of areas whose refractive index differs from that of the body material (this area is called the "modified refractive index area" hereinafter"). The periodic structure causes a Bragg diffraction within the crystal and produces an oscillation of laser light by amplifying light of a predetermined wavelength. Patent Document 1 discloses a two-dimensional photonic crystal surface-emitting laser light source in which an active layer containing a luminescent material is located between a pair of sheet electrodes and a two-dimensional photonic crystal is provided in the vicinity of that layer.

FIG. 1 shows the details of the structure of this conventional two-dimensional photonic crystal surface-emitting laser light source. This device includes a lower cladding layer (substrate) 11 covered with a spacer layer 161, on which an active layer 12 is located. The active layer 12 is covered with another spacer layer 162, on which a two-dimensional photonic crystal 13 is provided. The active layer 12 is made of a material that will emit light when an electric current flows into it. An example of such a material is a multi-quantum well (MQW) consisting of indium gallium arsenide (InGaAs)/gallium arsenide (GaAs). The two-dimensional photonic crystal 13 consists of a plate member having cylindrical holes 14 periodically arranged in a square lattice pattern. On this two-dimensional photonic crystal 13 are a spacer layer 163, an upper cladding layer 17 and a contact layer 18 laminated in this order. An upper electrode 191 is provided on the contact layer 18 and a lower electrode 192 beneath the lower cladding layer 11. The lower electrode 192 entirely covers the lower surface of the lower cladding layer 11, whereas the upper electrode 18 covers only a central portion of the upper surface of the contact layer 18. It should be noted that FIG. 1 has the two-dimensional photonic crystal 13 intentionally separated from the spacer layer 163 so that the structure of the two-dimensional photonic crystal 13 can be viewed. The two components should be tightly joined together when the device is actually created.

When the laser light produced by this conventional two-dimensional photonic crystal surface-emitting laser light source is observed at a point sufficiently distant from the contact layer 18, it will be found that the main beam is accompanied by weaker beams. These beams are generally called the side lobes. One of the reasons for the emergence of these side lobes is the presence of the upper electrode 191. As shown in FIG. 2, when the laser light is emitted from the surface of the contact layer 18, the upper electrode 191 blocks a portion of the two-dimensional emission. In this situation, rays of light emitted from the areas on both sides of the upper electrode 191 can constructively interfere at points separate from the central beam. Thus, the side lobes 22 are created at the points separate from the main peak 21.

Using an electrode made of a transparent material will most likely prevent the creation of such side lobes. However, the material must satisfy another condition; it must allow electric charges to be efficiently introduced into the active layer. Unfortunately, no materials currently available have these two properties: good transparency and high efficiency for the injection of electric charges.

[Patent Document 1] Japanese Unexamined Patent Application Publication No. 2000-332351 (Paragraphs [0037]-[0056], FIG. 1)

DISCLOSURE OF THE INVENTION

Problem to be Solved by the Invention

Thus, an objective of the present invention is to provide a two-dimensional photonic crystal surface-emitting laser light source, which is capable of producing a beam free from unnecessary side lobes.

Means for Solving the Problems

To achieve the aforementioned objective, the two-dimensional photonic crystal surface-emitting laser light source according to the present invention includes:

a) a substrate made of a material that is transparent to light having an objective wavelength;

b) an active layer located below the substrate;

c) a two-dimensional photonic crystal for amplifying light having the aforementioned objective wavelength, where the two-dimensional photonic crystal is located either between the substrate and the active layer or below the active layer and includes a plate-shaped body material in which a large number of areas whose refractive index differs from that of the body material are periodically arranged;

d) a mount layer to be in contact with an external member when the light source is mounted, where the mount layer is located below the two-dimensional photonic crystal and the active layer in such a manner where the distance between the lower surface of the mount layer and the active layer is smaller than the distance between the upper surface of the substrate and the active layer;

e) a window-shaped electrode on the upper surface of the substrate, where the electrode has a window for allowing laser light having the aforementioned objective wavelength to pass through; and f) a mount surface electrode located on the lower surface of the mount layer and having an area smaller than that of the window-shaped electrode inclusive of the area of the window.

It should be noted that this patent application assumes that the active layer is located on the "lower" side relative to the substrate. This notation is used to solely indicate the direction of the device and does not specify in what direction the two-dimensional photonic crystal surface-emitting laser light source according to the present invention should be directed when it is mounted.

(1) Structure of the Two-Dimensional Photonic Crystal Surface-Emitting Laser Light Source According to the Present Invention At this time, the construction of the two-dimensional photonic crystal surface-emitting laser light source according to the present invention is now described. The present light source is similar to the conventional type of two-dimensional photonic crystal surface-emitting laser light source in that the active layer and the two-dimensional photonic crystal are located on one side of the substrate, with a pair of electrodes provided on the upper and lower sides. Here, the laminating order of the active layer and the two-dimensional photonic crystal is not important. The laminated structure consisting of the active layer and the two-dimensional photonic crystal is hereinafter referred to as the "laser oscillator", whenever appropriate. In the laser light source according to the present invention, the mount layer is located on the lower side of the laser oscillator. In other words, the present light source has the laser oscillator (i.e. the active layer and the two-dimensional photonic crystal) between the substrate and the mount layer. It is possible to insert a spacer or similar member between any of the layers mentioned thus far, including the case where the inserting position is between the two-dimensional crystal and the active layer.

Since an external substrate or similar object is attached to the mount layer, the laser light must be emitted from the upper surface of the substrate of the laser light source (It should be noted that "the substrate" refers to the substrate of the laser light source of the present invention, if not otherwise specified). Therefore, the substrate is made of a transparent material that allows the laser light having an objective wavelength to pass through it and be extracted to the outside. Accordingly, in the present invention, the upper surface of the substrate is called the "emission surface."

The active layer and the two-dimensional photonic crystal may be the same as the conventional ones. A two-dimensional photonic crystal is created from a plate-shaped body material by periodically arranging a large number of "modified refractive index areas" in a plate-shaped body material. The "modified refractive index area" is an area whose refractive index differs from that of the body material. The areas can be created by embedding foreign members whose refractive index differs from that of the body material into the body material or by creating holes. The latter method is more preferable in that it provides a larger difference in refractive index between the body material and the modified refractive index area. Moreover, holes are easier to create. However, in the case where the two-dimensional photonic crystal needs to be fused onto another layer at a high temperature in the manufacturing process, the holes can be deformed due to the high temperature. In such a case, it is reasonable to embed an appropriate kind of foreign members into the body material rather than create holes.

The mount layer provides an interface for the laser light source to connect to an external substrate or similar object. When connected to an external object, the lower surface of the mount layer ("mount surface") serves as a radiator through which heat generated within the laser light source (particularly, the active layer) can escape.

One of the two electrodes is located on the upper surface of the substrate. This electrode is provided with a window for allowing the laser light of an objective wavelength to pass through. This electrode is hereinafter called the "window-shaped electrode." For example, the window-shaped electrode may consist of a plate electrode whose central portion is cut away. The material of this electrode does not need to be transparent to the laser light oscillated by the laser light source. Therefore, as in the case of the conventional two-dimensional photonic crystal surface-emitting laser light source, it is possible to use a common electrode material that is suitable for the injection of electric charges.

The other electrode is on the lower surface of the mount layer. This electrode is hereinafter called the "mount surface electrode." The area of the mount surface electrode is smaller than that of the window-shaped electrode including the window area. The thicknesses of the substrate, mount layer and other layers are set so that the distance between the mount surface electrode (or the mount surface) and the active layer is smaller than that between the window-shaped electrode (or the emission surface) and the active layer.

The reason for the aforementioned designing of the area of the mount surface electrode and the distance of each electrode from the active layer can be explained as follows: The present invention uses the window-shaped electrode to prevent the emergence of side lobes. The area of the window-shaped electrode including the window area is larger than that of an ordinary electrode that has no window. Unfortunately, use of a larger electrode will lower the light-emitting efficiency for the same amount of electric charges injected through the electrode since the electric charges will be distributed over a larger area within the active layer. To compensate for this effect, the area of the mount surface electrode is designed to be smaller than that of the window-shaped electrode including the window area. This area-designing makes the electric current flow through a conic region, spreading from the mount surface electrode toward the window-shaped electrode. Furthermore, the previously-described designing of the distances between the window-shaped electrode and the active layer and between the active layer and the mount surface electrode makes the active layer come closer to the mount surface electrode, which has the smaller area. This positioning increases the current density within the active layer, whereby the emission intensity is increased.

To adequately increase the current density within the active layer and achieve an emission intensity higher than that of the conventional two-dimensional photonic crystal surface-emitting laser light source, it is desirable that the ratio of the area of the window-shaped electrode including the window area to that of the mount surface electrode be within a range from 2:1 to 400:1 and the ratio of the distance between the emission surface and the active layer to the distance between the mount surface and the active layer be within a range from 2:1 to 400:1.

Positioning the active layer close to the mount surface electrode has another advantage as follows:

In the conventional two-dimensional photonic crystal surface-emitting laser light source, the mount surface is on the substrate side. In this case, since the substrate occupies the major portion of the entire thickness of the laser light source device, the active layer is significantly separated from the mount surface. Due to this construction, the heat generated by the recombination of positive holes and electrons can barely escape to the outside, so that the emission efficiency of the laser light (i.e. the ratio of the emission intensity to the injected current) is low. By contrast, in the two-dimensional photonic crystal surface-emitting laser light source according to the present invention, the active layer is located close to the mount surface (i.e. the lower surface of the mount layer). Therefore, the heat can easily be released to the outside, so that the emission efficiency is higher than the conventional levels.

(2) Two-Dimensional Photonic Crystal Surface-Emitting Laser Light Source with Reflector It is preferable that a reflector for reflecting the laser light having an objective wavelength be provided below the laser oscillator (i.e. between the laser oscillator and the mount surface electrode). This construction will improve the emission efficiency.

Specifically, the previous construction may be achieved as follows:

the mount layer is made of a conductive material, a portion of the lower surface of the mount layer is defined as the conductive area, and an insulating area is created around the conductive area; and the mount surface electrode made of a material reflecting the laser light having the objective wavelength is placed so that it covers the conductive area.

In this construction, only a limited portion of the mount surface electrode (i.e. the portion that is located beneath the conductive area) practically functions as the mount surface electrode and contributes to the injection of electric current into the active layer. This construction not only increases the current density within the active layer but also improves the emission efficiency since the mount surface electrode reflects the laser light. The insulating area can be created by injecting resistance-increasing ions into the mount layer.

In any type of two-dimensional photonic crystal surface-emitting laser light source, the laser oscillator emits the laser light in both upper and lower directions. The light emitted to the opposite side (i.e. the mount surface side in the present invention) of the emission surface will be lost if there is no means for redirecting that light to the emission side. In the conventional two-dimensional photonic crystal surface-emitting laser light source in which a relatively large lower electrode is located on the side opposite to the emission surface, a portion of the light emitted to the opposite side of the laser oscillator is reflected by the lower electrode and then extracted from the emission surface. However, the reflection efficiency is low since the lower electrode is not designed to efficiently reflect the light. This problem is more serious in the present invention since the mount surface electrode, which corresponds to the aforementioned lower electrode, is smaller. Therefore, if no appropriate measure is taken, the reflection efficiency will further decrease and the extraction efficiency from the emission surface will also decrease. This problem can be solved by providing a reflector below the laser oscillator, i.e. on the side opposite to the window-shaped electrode. Thus, the light can be extracted more efficiently from the side on which the window-shaped electrode is located.

It is desirable that the distance between the laser oscillator and the reflector be set so that a reflected light emitted from the laser oscillator and then reflected by the reflector can constructively interfere with a light directly emitted from the laser oscillator to the side on which the window-shaped electrode is located. The aforementioned distance can be set by regulating the thickness of the buffer layer, cladding layer or other distance-adjusting layer provided between the laser oscillator and the reflector.

It should be noted that the aforementioned distance is defined as the distance between the surface of the two-dimensional photonic crystal on the reflector side and the reflective surface of the reflector.

Effect of the Invention

In the two-dimensional photonic crystal surface-emitting laser light source according to the present invention, the laser light emitted from the laser oscillator is extracted from the opposite side to the mount layer, i.e. the side on which the window-shaped electrode having a window is located, without being blocked by the electrode. Therefore, the problem of side lobes is prevented; such side lobes will emerge if the light is blocked by the electrode and rays of light emitted from the areas on both sides of the electrode interfere with each other, as in the conventional two-dimensional photonic crystal surface-emitting laser light source.

In the two-dimensional photonic crystal surface-emitting laser light source according to the present invention, the distance between the mount surface and the active layer is smaller than the distance between the emission surface and the active layer. Therefore, the heat generated from the active layer due to recombination of positive holes and electrons can easily be released to the outside, so that the emission efficiency (i.e. the ratio of the emission intensity to the injected current) is higher than the conventional levels.

Since the area of the mount surface electrode is adequately smaller than that of the window-shaped electrode and the mount surface electrode is located closer to the active layer than the window-shaped electrode, the electric current is injected into a small zone of the active layer, whereby the emission efficiency is improved.

In the case where the two-dimensional photonic crystal surface-emitting laser light source according to the present invention is provided with the reflector, the light emitted from the laser oscillator toward the mount surface electrode is reflected by the reflector and extracted from the emission surface with the directly emitted light. Thus, even though the mount surface electrode used here is small and cannot adequately reflect the emitted light, the loss of laser light is minimized, so that a strong ray of the laser light can be extracted to the outside.

It is possible to further intensify the laser light by setting the distance between the laser oscillator and the reflector so that the reflected light can constructively interfere with the directly emitted light.

EXPLANATION OF NUMERALS

| | |
|---|---|
| 11 | Lower Cladding Layer |
| 12, 32, 42 | Active Layer |
| 13, 33, 43 | Two-Dimensional Photonic Crystal |
| 14, 332, 432 | Hole |
| 161, 162, 163 | Spacer Layer |
| 17 | Upper Cladding Layer |
| 18 | Contact Layer |
| 191 | Upper Electrode |
| 192 | Lower Electrode |
| 21 | Main Peak |
| 22 | Side Lobe |
| 31, 41 | Device Substrate |
| 331, 431 | Body Material |
| 341, 342, 441, 442 | Cladding Layer |
| 35 | Mount Layer |
| 36, 46 | Window-Shaped Electrode |
| 361, 461 | Window |
| 37, 47 | Mount Surface Electrode |
| 38 | Mount Surface |
| 39, 49 | Spacer |
| 401 | Region through Which Electric Current Flows |
| 402 | External Member |
| 45 | Reflector |
| 51, 52, 53, 54 | Laser Light |
| 61 | Plate Member |
| 611 | Central Area of Plate Member 61 Located Immediately below Conductive Area 621 |
| 62 | Conductive Area-Limiting Layer |
| 621 | Conductive Area |
| 622 | Insulating Area |

BEST MODES FOR CARRYING OUT THE INVENTION

(1) First Embodiment

Figure 1:
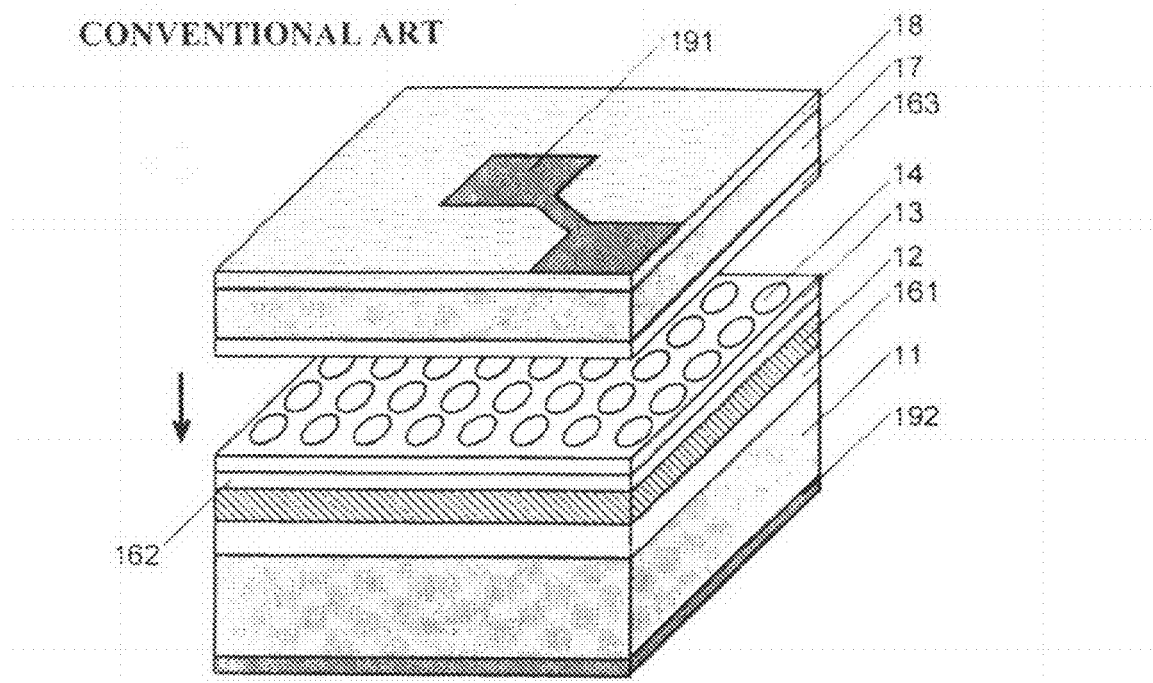
FIG. 1 is a perspective view of a conventional two-dimensional photonic crystal surface-emitting laser light source.
Figure 2:
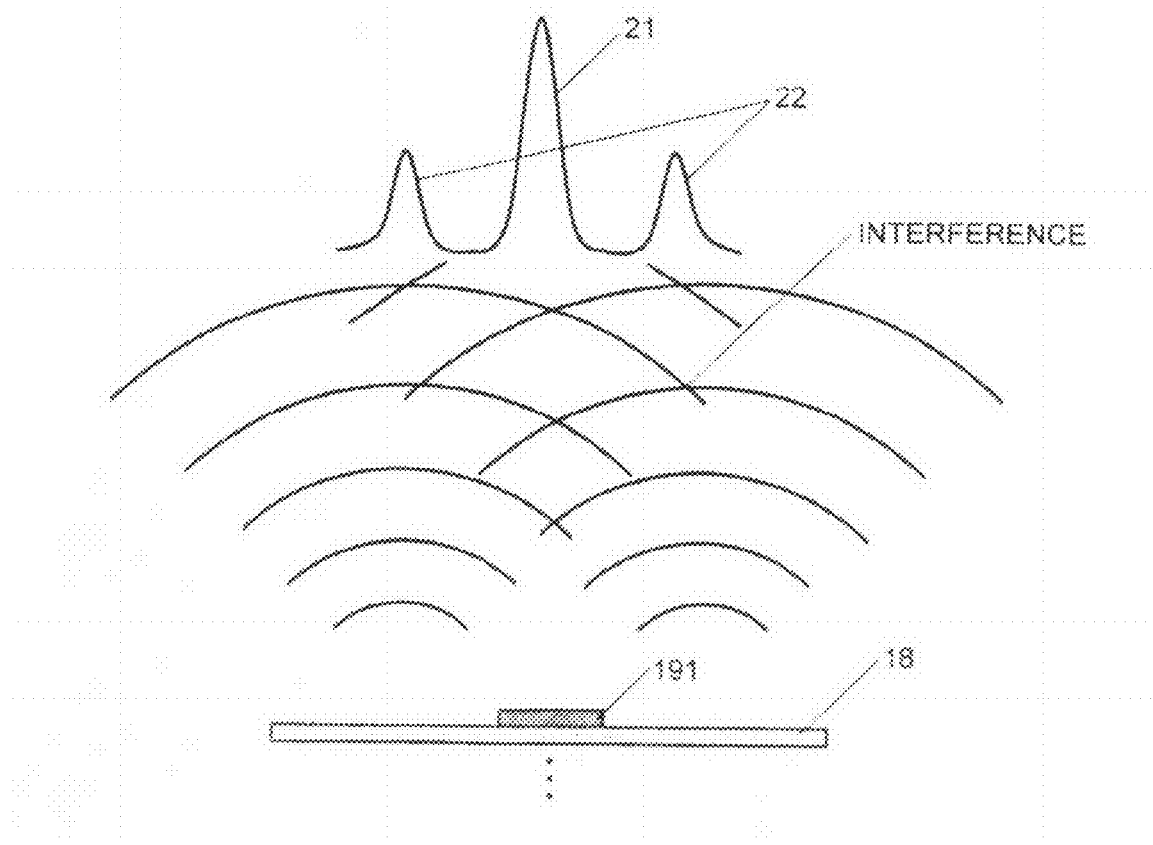
FIG. 2 is a diagram showing how side lobes are created.
Figure 3:
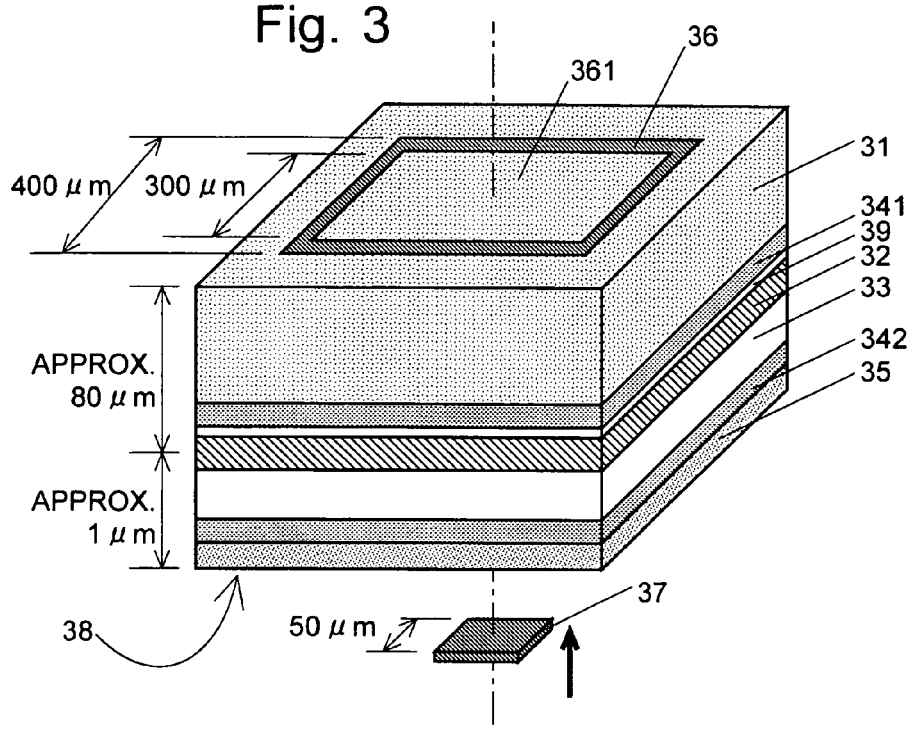
FIG. 3 is a perspective view of a two-dimensional photonic crystal surface-emitting laser light source according to the first embodiment of the present invention.
Figure 4:
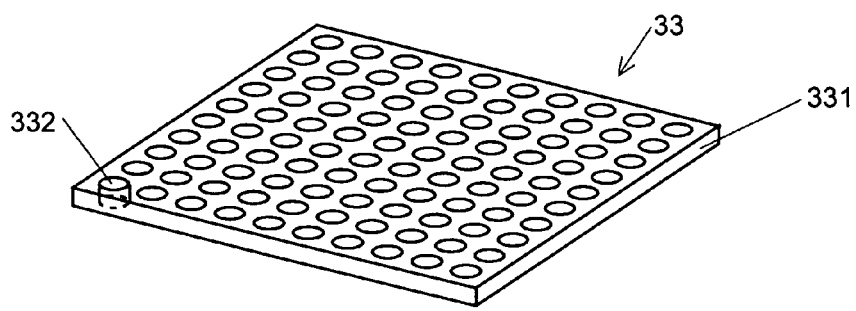
FIG. 4 is a perspective view showing the structure of the two-dimensional photonic crystal in the first embodiment.
Figure 5:
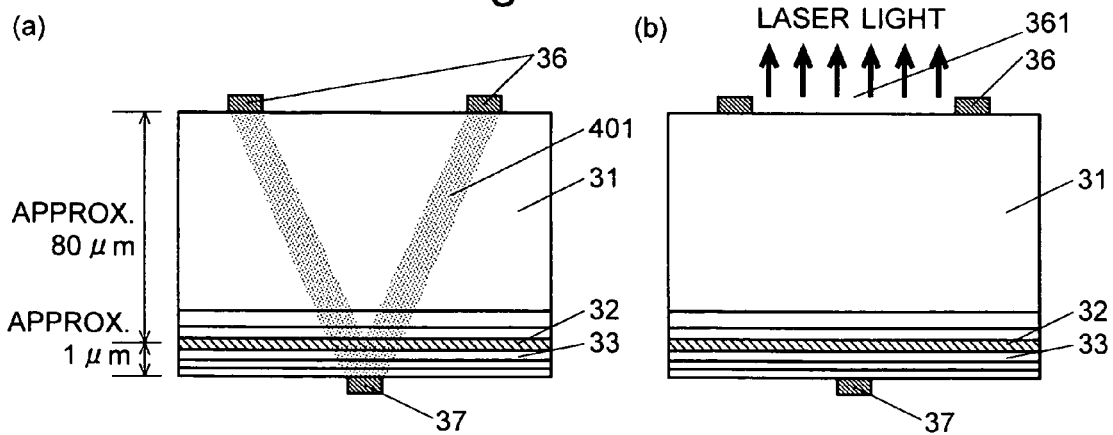
FIGS. 5(a) and 5(b) are vertical sectional views showing the operation of the laser light source of the first embodiment.

Two-Dimensional Photonic Crystal Surface-Emitting Laser Light Source Having No Reflector The first embodiment of the two-dimensional photonic crystal surface-emitting laser light source (which is simply called the "laser light source" hereinafter) according to the present invention is described with reference to FIGS. 3 through 7. FIG. 3 is a perspective view of the laser light source of the first embodiment. This laser light source includes a device substrate 31 made of an n-type semiconductor of gallium arsenide (GaAs), under which an active layer 32 made of indium gallium arsenide (InGaAs)/gallium arsenide (GaAs) and having multiple-quantum wells (MQW) is located, with a cladding layer 341 and a spacer 39 in between. Under the active layer 32 is a two-dimensional photonic crystal 33. In the first embodiment, the two-dimensional photonic crystal 33 is a plate-shaped body material 331 made of a p-type semiconductor of GaAs in which cylindrical holes 332 are periodically arranged in a square lattice pattern (FIG. 4). Each side of the square lattice is 285 nm in length. Under the two-dimensional photonic crystal 33, a mount layer 35 is located, with a cladding layer 342 in between. The lower surface of the mount layer 35 serves as the mount surface 38. The mount layer 35 is a plate member made of GaAs with an insulating film (e.g. $SiO_2$) covering the mount surface 38.

On the upper surface (emission surface) of the device substrate 31, a window-shaped electrode 36 with a central square window is located. This electrode consists of a frame-shaped square member made of an alloy of gold, germanium and nickel. Located on the mount surface 38 is a mount surface electrode 37 consisting of a square plate made of an alloy of gold and zinc. It should be noted that FIG. 3 has the mount surface electrode 37 intentionally separated from the mount surface 38 so that it will be viewable on the drawing. The electrode should be tightly attached to the mount surface 38 when the device is actually created. In the first embodiment, the laser light source is not provided with the reflector.

The key dimensions of the components of the laser light source in the first embodiment are as follows: The length of each side of the window-shaped electrode 36 is 400 μm. The length of each side of the window 361 is 300 μm. The length of each side of the mount surface electrode 37 is 50 μm. The distance between the upper surface of the device substrate 31 and the active layer 32 is approximately 80 μm (the thickness of the device substrate 31 is approximately 80 μm, and the total thickness of the cladding layer 341 and the spacer 39 is approximately 1 μm). The distance between the active layer 32 and the mount surface 38 is approximately 1 μm (the thickness of the two-dimensional photonic crystal is 0.12 μm and the total thickness of the cladding layer 342 and the mount layer 35 is approximately 1 μm). It should be noted that the components shown in FIG. 3 are depicted by dimensional ratios different from the actual values so that every component is viewable.

The laser light source in the first embodiment operates as follows: A voltage is applied between the window-shaped electrode 36 and the mount surface electrode 37 to pass an electric current between the two electrodes. This electric current introduces electrons and positive holes into the device and they recombine within the active layer 32, whereby light is emitted. Since the area of the window-shaped electrode 36 is larger than that of the mount surface electrode 37, the electric current flows within a conic region 401 spreading from the mount surface electrode 37 to the window-shaped electrode 36, as shown in FIG. 5(a). At the active layer 32, which is located close to the mount surface electrode 37, the cross section of the region 401 is smaller than that at any other position closer to the window-shaped electrode 36. Therefore, the current density at the active layer 32 is high.

Among the components of light generated within the active layer 32, the component having a specific wavelength is intensified within the two-dimensional photonic crystal 33 due to interference and produces a laser oscillation in the same manner as the two-dimensional photonic crystal surface-emitting laser light source. The laser light thereby generated is emitted from the surface of the device substrate 31 to the outside. Since the window-shaped electrode 36 on the device substrate 31 has the window 361, the light can be emitted through that window 361 without being blocked by the electrode 36, as shown in FIG. 5(b). Therefore, the laser beam produced by the laser light source in the present embodiment does not have unnecessary side lobes around it; such side lobes will emerge if rays of laser light are emitted from many areas around an electrode and interfere with each other, as in the conventional two-dimensional photonic crystal surface-emitting laser light source.

Figure 6:
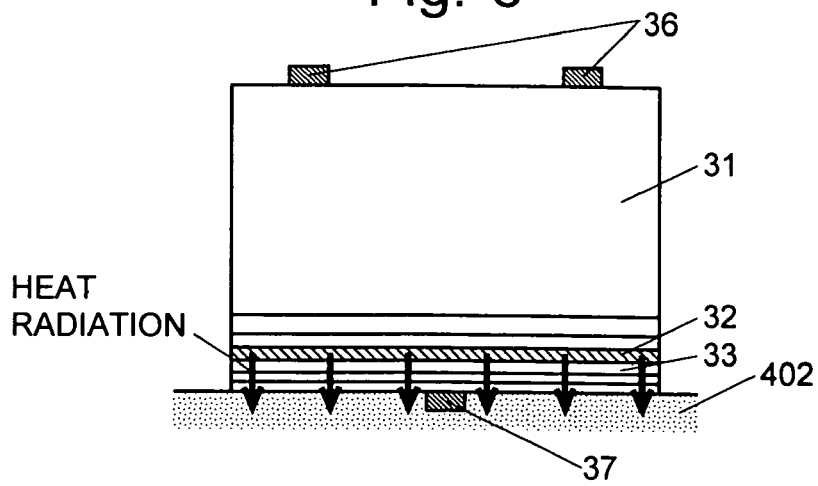
FIG. 6 is a vertical sectional view of the laser light source of the first embodiment mounted on another object.

In the present embodiment, the laser light source should be mounted on an external member 30 so that the mount surface 38 is in contact with the member 30, as shown in FIG. 6. Since the lower surface of the mount layer 35, which is chosen as the mount surface 38, is not on the front side of the device substrate 31 but at the back of the substrate, the distance between the active layer 32 and the mount surface 38 is significantly small. Therefore, heat generated within the device can effectively be radiated, whereby negative effects of the heat are suppressed and a high level of emission efficiency is achieved.

Figure 7:
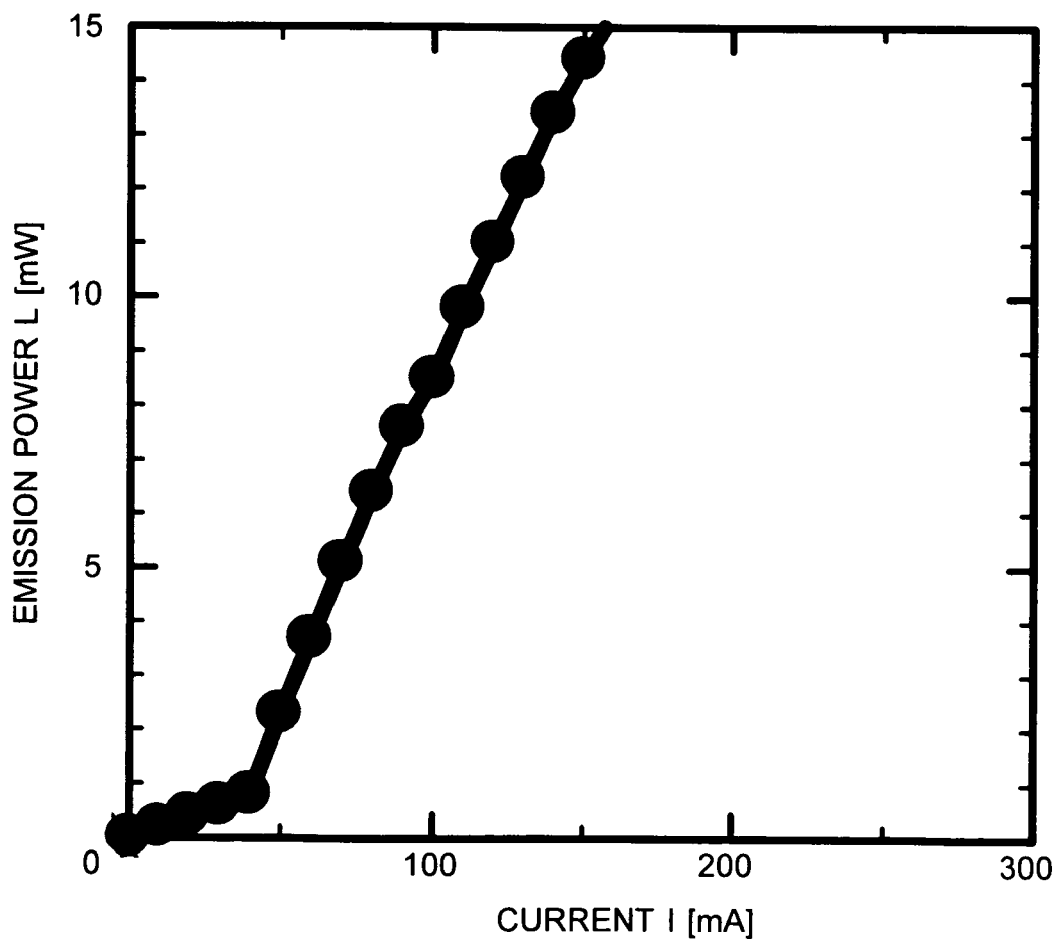
FIG. 7 is a graph showing the injected current (I)/emission power (L) characteristic in the laser light source of the first embodiment.

FIG. 7 is an I-L characteristic graph showing an experimentally determined relationship between the injected current I (unit: mA) and the emission power L (unit: W). The graph shows that the emission power of the laser light source in the present embodiment can exceed 15 mW; such a high level of emission power could not be achieved by the conventional two-dimensional photonic crystal surface-emitting laser light source. Presumably, the rise in the emission power results from an improvement in the radiating effect due to the junction-down mounting of the device.

(2) Second Embodiment

Figure 8:
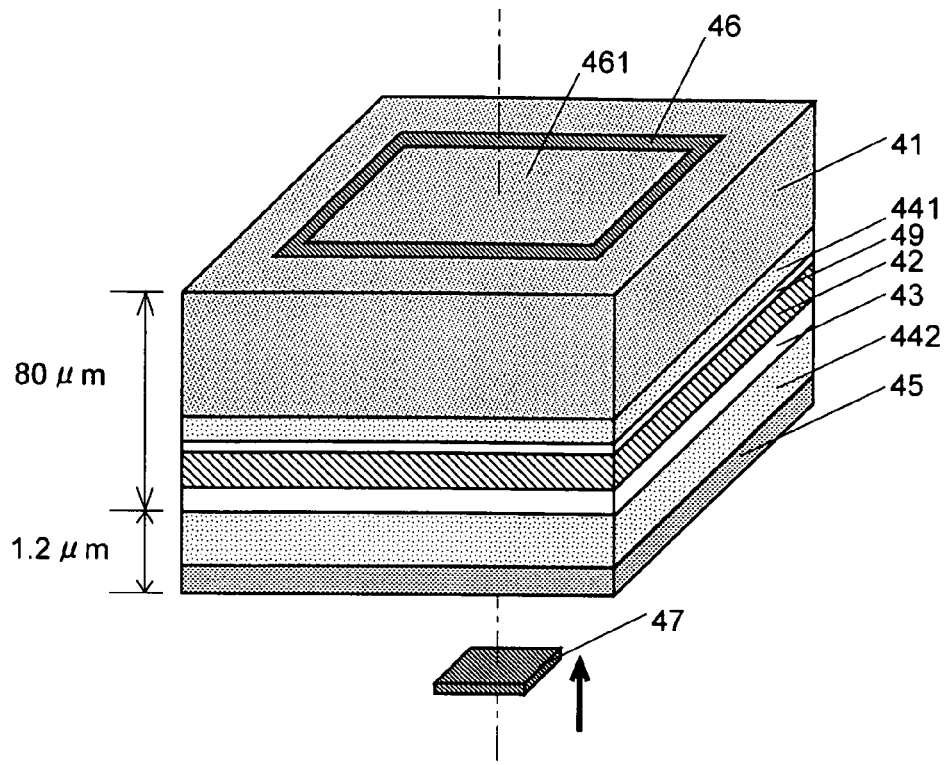
FIG. 8 is a perspective view of a two-dimensional photonic crystal surface-emitting laser light source according to the second embodiment of the present invention.
Figure 9:
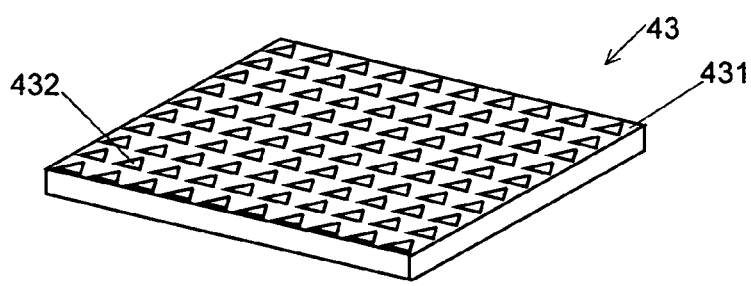
FIG. 9 is a perspective view showing the structure of the two-dimensional photonic crystal in the second embodiment.
Figure 10:
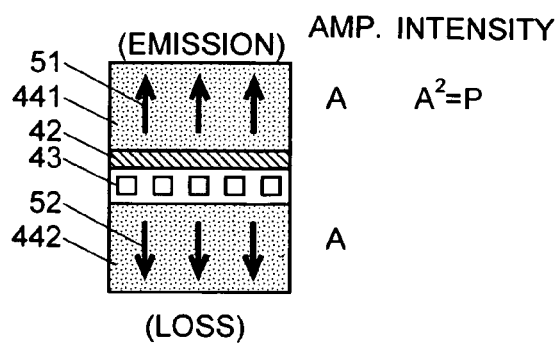
FIGS. 10(a) and 10(b) illustrate how the amplitude and the intensity of the laser light is affected by the presence of the reflector in the second embodiment.
Figure 10:
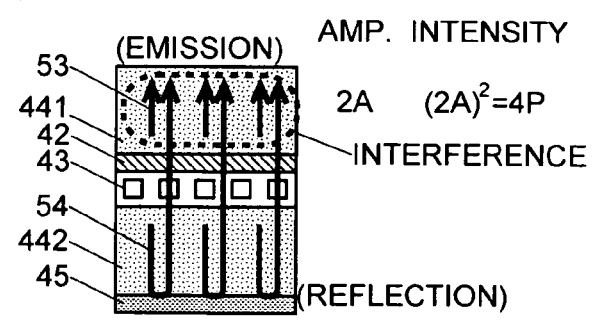

Two-Dimensional Photonic Crystal Surface-Emitting Laser Light Source Having a Reflector As the second embodiment of the present invention, a surface-emitting laser having a reflector is described with reference to FIGS. 8 through 12. FIG. 8 is a perspective view of the surface-emitting laser in the second embodiment. This surface-emitting laser includes a device substrate 41 made of an n-type semiconductor of gallium arsenide (GaAs), under which an active layer 42 made of indium gallium arsenide (InGaAs)/gallium arsenide (GaAs) and having multiple-quantum wells (MQW) is located, with a cladding layer 441 and a spacer 49 in between. Under the active layer 42 is a two-dimensional photonic crystal 43. In the second embodiment, the two-dimensional photonic crystal 43 is a plate-shaped body material 431 made of a p-type semiconductor of GaAs in which equilateral-triangular holes 432 are periodically arranged in a square lattice pattern (FIG. 9). The active layer 42 and the two-dimensional photonic crystal 43 constitute the laser oscillator. It should be noted that the active layer 42 and the two-dimensional photonic crystal 43 can be transposed.

Like the aforementioned equilateral-triangular holes, the holes may have an asymmetrical shape with respect to at least one of the axes of the square lattice pattern. This design is effective to impede the interference of laser light emitted from the laser oscillator (i.e. the active layer 42 and the two-dimensional photonic crystal 43) and thereby more assuredly suppress the emergence of side lobes. It should be noted that the two-dimensional photonic crystal 43 having the equilateral-triangular holes can be also used in the first embodiment. Conversely, the two-dimensional photonic crystal 33 having the cylindrical holes may be used in the second embodiment.

Under the two-dimensional photonic crystal 43, a reflector 45 is located, with a cladding layer 442 made of p-type AlGaAs in between. For example, a GaAs/AlGaAs multilayer film can be used as the reflector 45. On the upper surface of the reflector 45, a reflective surface for reflecting laser light emitted from the surface-emitting laser in the second embodiment is formed.

On the upper surface (emission surface) of the device substrate 41, a window-shaped electrode 46 is located. This electrode consists of a frame-shaped square member having a central square window. Located below the reflector 45 is a mount surface electrode 47 having a square plate whose area is smaller than that of the window-shaped electrode 46. It should be noted that FIG. 8 has the mount surface electrode 47 intentionally separated from the reflector 45 so that it will be viewable on the drawing. The electrode should be tightly attached to the reflector 45 when the device is actually created.

The thickness of the device substrate 41 and the cladding layers 441 and 442 are regulated so that the distance L between the lower surface of the two-dimensional photonic crystal 43 and the upper surface of the reflector 45 is adequately smaller than the distance L' between the lower surface of the two-dimensional photonic crystal 43 and the upper surface of the device substrate 41. In the surface-emitting laser in the second embodiment, the distance L is approximately 1.2 μm and the distance L' is approximately 80 μm. Furthermore, the distance L is finely adjusted so that a ray of light emitted from the upper surface of the two-dimensional photonic crystal 43 and another ray of light emitted from the lower surface of the two-dimensional photonic crystal 43 and then reflected by the reflector 45 will constructively interfere with each other. This adjustment should take into account the phase change of light, which takes place when the light is reflected by the reflector 45. It should be noted that the components shown in FIG. 8 are depicted by dimensional ratios different from the actual values so that every component is viewable.

The surface-emitting laser in the second embodiment operates as follows: A voltage is applied between the window-shaped electrode 46 and the mount surface electrode 47 to pass an electric current between the two electrodes. This electric current introduces electrons and positive holes into the device and they recombine within the active layer 42, whereby light is emitted. Among the components of light generated within the active layer 32, the component having a specific wavelength is intensified within the two-dimensional photonic crystal 43 due to interference and produces a laser oscillation.

In terms of intensity ratio, approximately 50% of the laser light thereby generated is directly emitted from the two-dimensional photonic crystal 43 toward the window-shaped electrode 46, while the remaining, approximately 50% of light is emitted toward the reflector 45. The latter portion of the laser light is reflected by the upper surface of the reflector 45 and then propagated toward the side where the window-shaped electrode 46 is located. The reflected light and the directly emitted light interfere over the two-dimensional photonic crystal 43. This interference intensifies the laser light since the distance L is finely adjusted so that the interference takes place in a constructive manner. The interference light is emitted through the window 461 of the window-shaped electrode 46 to the outside.

FIGS. 10(a) and 10(b) schematically illustrate how the presence of the reflector affects the amplitude and intensity of laser light emitted from the window 461 to the outside; FIG. 10(a) shows a surface-emitting laser whose configuration is identical to the second embodiment except that it has no reflector, and FIG. 10(b) shows the surface-emitting laser in the second embodiment.

In the case where no reflector is present, both the laser light 51 emitted from the upper surface of the two-dimensional photonic crystal 43 and the other laser light 52 emitted from the lower surface have the same amplitude A. From the window 461, only the laser light 51 having an amplitude of A is extracted. Its intensity (i.e. the energy per unit time) p is proportional to the square of the amplitude. The other laser light 52, which has the same amplitude of A and the same intensity P, cannot be extracted from the window 461 and will be finally lost. In this example, the energy of the laser light emitted from the laser oscillator per unit time is 2 P.

In the case of the second embodiment, both the laser light (directly emitted light) 53 emitted from the upper surface of the two-dimensional photonic crystal 43 and the other laser light (reflected light) 54 emitted from the lower surface have the same amplitude A, which also equals the amplitude observed in the case where no reflector is present. The laser light 54 is reflected by the reflector 45 and then propagated toward the window 461. During the propagation, the reflected light 54 interferes with the other laser light 53, creating an interference light whose amplitude equals 2A, the sum of the amplitude of the laser light 53 and that of the laser light 54. The intensity of the interference light equals the square of the amplitude, i.e. 4 P. This means that the intensity of the laser light emitted from the emission surface in the second embodiment is four times the intensity observed in the case where no reflector is present. The energy of the laser light emitted from the laser oscillator in the second embodiment is 4 P.

The Q-value of the surface-emitting laser in the second embodiment was calculated by a three-dimensional FDTD method, for various values of distance L including the aforementioned 8.5-wavelengths. For convenience of computing capacity, it was assumed that the two-dimensional photonic crystal had an infinite periodic structure only in one direction. The Q-value of a surface-emitting laser is given by:

$$1/Q = 1/Q_\perp + 1/Q_\parallel \quad (1),$$

where $Q_\perp$ is a Q-value in a direction perpendicular to the two-dimensional photonic crystal and $Q_\parallel$ is a Q-value in a direction parallel to the same crystal.

Figure 11:
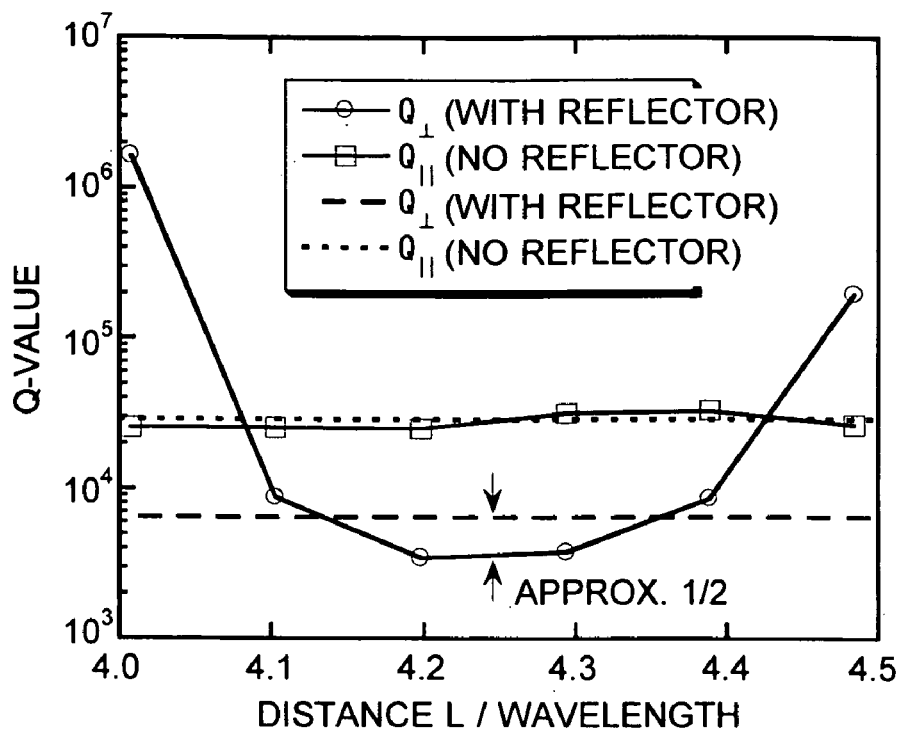
FIG. 11 is a graph showing the results of calculating Q-values for the second embodiment and another case where no reflector was used.

The results of calculation of $Q_\perp$ and $Q_\parallel$ are shown in FIG. 11. In this figure, the abscissa indicates the distance L in units of the wavelength of the laser light. The distance L multiplied by two equals the optical path difference between the directly emitted light and the reflected light. Accordingly, the range of abscissa shown in FIG. 11 corresponds to an optical path difference that equals one wavelength.

$Q_\parallel$ takes approximately equal values irrespective of the distance L. This is because the second embodiment and the other example having no reflector have no structural difference in any direction parallel to the two-dimensional photonic crystal. By contrast, $Q_\perp$ changes its value depending on L and due to whether or not the reflector 45 is present.

$Q_\perp$ takes the minimum value when the distance L equals 4.25 wavelengths. The minimum value is approximately one half of the value in the case of the surface-emitting laser having no reflector. This result agrees with the previous calculation: the energy output of the laser oscillator of the surface-emitting laser in the comparative example is 2 P, the energy output of the laser oscillator of the surface-emitting laser at a distance L of 4.25 wavelengths is 4 P, and 2 P is one half of 4 P. When the distance L is within the range from approximately 4.13 wavelengths to approximately 4.37 wavelengths, $Q_\perp$ is smaller than in the comparative example, so that a stronger emission of laser light is obtained.

FIG. 11 shows $Q_\perp$ and $Q_\parallel$ only within the range from 4.0 to 4.5 wavelengths in distance L. Even if the distance L is outside this range, $Q_\parallel$ is approximately constant irrespective of the distance L, whereas $Q_\perp$ periodically changes in units of 0.5 wavelength due to the effect of the previously described interference.

Next, the external differential quantum efficiency of the surface-emitting laser in the second embodiment is calculated in the case where the distance equals 4.25 wavelengths. An external differential quantum efficiency is defined as a fraction having the number of carriers injected into the active layer as the denominator and the number of photons of the laser light emitted to the outside as the numerator. When this value is large, it means that the laser light can efficiently be produced by a weak electric current. The external differential quantum efficiency $\eta_d$ is given by:

$$\eta_d \propto \eta = \frac{1/Q_{\perp+}}{1/Q_{\perp+} + 1/Q_{\perp-} + 1/Q_\parallel + 1/Q_i} \quad (2)$$

where $Q_{\perp+}$ is the Q-value of an energy emitted from the upper side of the two-dimensional photonic crystal, $Q_{\perp-}$ is the Q-value of an energy emitted from the lower side of the same crystal, $Q_\parallel$ is the Q-value relating to of the direction parallel to the two-dimensional photonic crystal, and $Q_i$ is the Q-value relating to the internal loss of the surface-emitting laser. If there is no reflector, $Q_{\perp+}$ equals $Q_{\perp-}$ (this value is denoted by $Q_0$). In this case, the external differential quantum efficiency $\eta_1$ is expressed as follows:

$$\eta_1 = \frac{1/Q_0}{2/Q_0 + 1/Q_\parallel + 1/Q_i} \quad (3)$$

In the case of the second embodiment, since the reflector is present, $1/Q_{\perp-} = 0$ and $Q_{\perp+}$ equals one quarter of $Q_{\perp+}$ in the comparative example. Therefore, the external differential quantum efficiency $\eta_2$ in the second embodiment is given by:

$$\eta_2 = \frac{4/Q_0}{4/Q_0 + 1/Q_\parallel + 1/Q_i} \quad (4)$$

Here, it should be noted that the values of $Q_0$ and $Q_\parallel$ are common to both the present embodiment and the comparative example. Therefore, on the assumption that $Q_i$ is also common to both cases, it can be derived from equations (3) and (4) that $\eta_1$ and $\eta_2$ satisfy the following relationship:

$$\eta_2 = \frac{4}{2 + 1/\eta_1} \quad (5)$$

Figure 12:
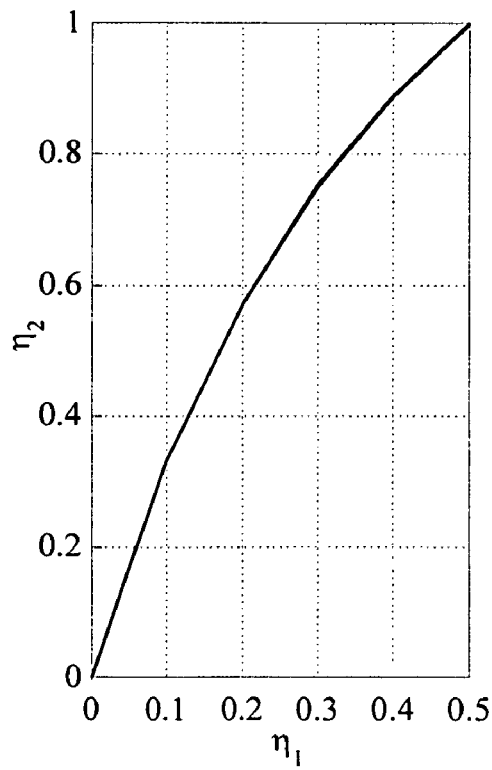
FIG. 12 is a graph comparing the external differential quantum efficiency $\eta_1$ of a surface-emitting laser having no reflector and the same efficiency $\eta_2$ of another surface-emitting laser according to the second embodiment.

The graph in FIG. 12 shows the relationship between $\eta_1$ and $\eta_2$ expressed by equation (5). In the example where no reflector is present, one half of the laser light emitted from the two-dimensional photonic crystal (i.e. the portion emitted from the lower side of the two-dimensional photonic crystal) is lost. Therefore, the maximum value of $\eta_1$ is 0.5. If $\eta_1 = 0.5$, there is no loss of laser light except for the portion emitted from the lower side of the two-dimensional photonic crystal. The graph shows that $\eta_1 = 0.5$ corresponds to $\eta_2 = 1$. This suggests that, if a surface-emitting laser is free from any kind of light loss other than the aforementioned one, it is possible to reduce the light loss to zero by providing the laser with a reflector. In this situation, $\eta_2/\eta_1$ equals 2, and this value is larger than 2 if $\eta_1 < 0.5$. For example, $\eta_2/\eta_1 = 2.5$ when $\eta_1 = 0.3$, and $\eta_2/\eta_1 = 3.3$ when $\eta_1 = 0.1$.

If $\eta_1$ is smaller than 0.5, it suggests that there is a loss of light in the direction parallel to the two-dimensional photonic crystal or an internal loss in addition to the emission of laser light from the lower surface of the two-dimensional photonic crystal. From the fact that $\eta_2/\eta_1$ is larger than 2 when $\eta_1$ is smaller than 0.5, it can be said that the improvement of surface emission efficiency is more remarkable as the aforementioned additional loss is larger.

(3) Third Embodiment

With the Mount Surface Electrode Member Used as the Reflector

Figure 13:
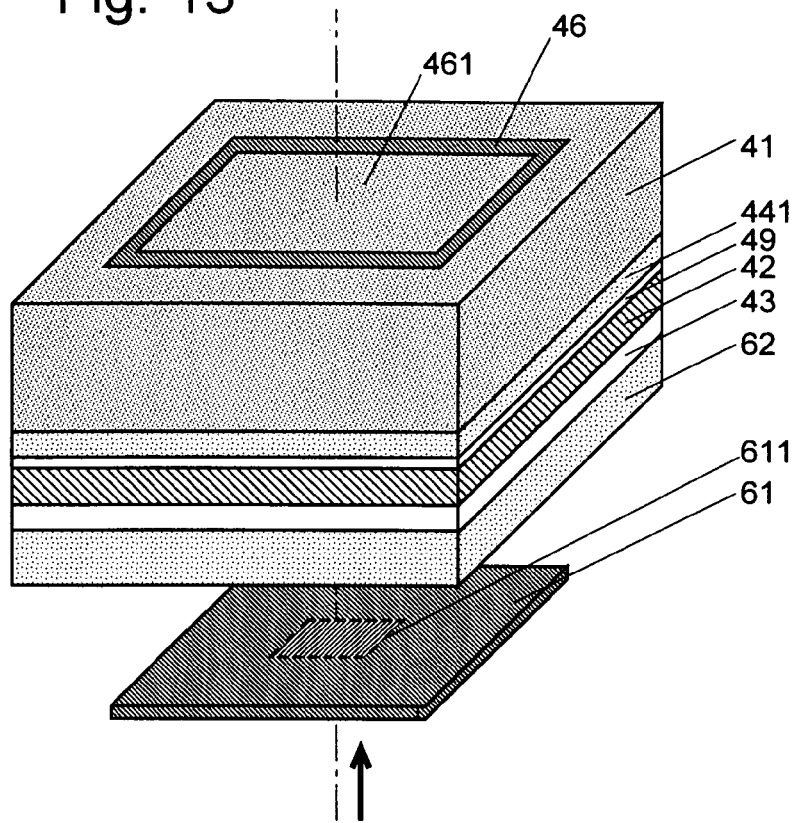
FIG. 13 is a perspective view showing the structure of the two-dimensional photonic crystal in the third embodiment.

As the third embodiment of the present invention, a surface-emitting laser utilizing the mount surface electrode as the reflector is described with reference to FIGS. 13 and 14. FIG. 13 is a perspective view of the surface-emitting laser in the third embodiment. In this figure, those components which have already mentioned in the second embodiment are denoted by the same numerals as used in the second embodiment (FIG. 8). In the surface-emitting laser in the third embodiment, a plate member 61 made of the same material as that of the mount surface electrode 47 is used in place of the reflector 45 in the second embodiment. Also, the cladding layer 442 is replaced by a conductive area-limiting layer 62 as the mount layer. The other parts of the construction are the same as those of the surface-emitting laser in the second embodiment.

Figure 14:
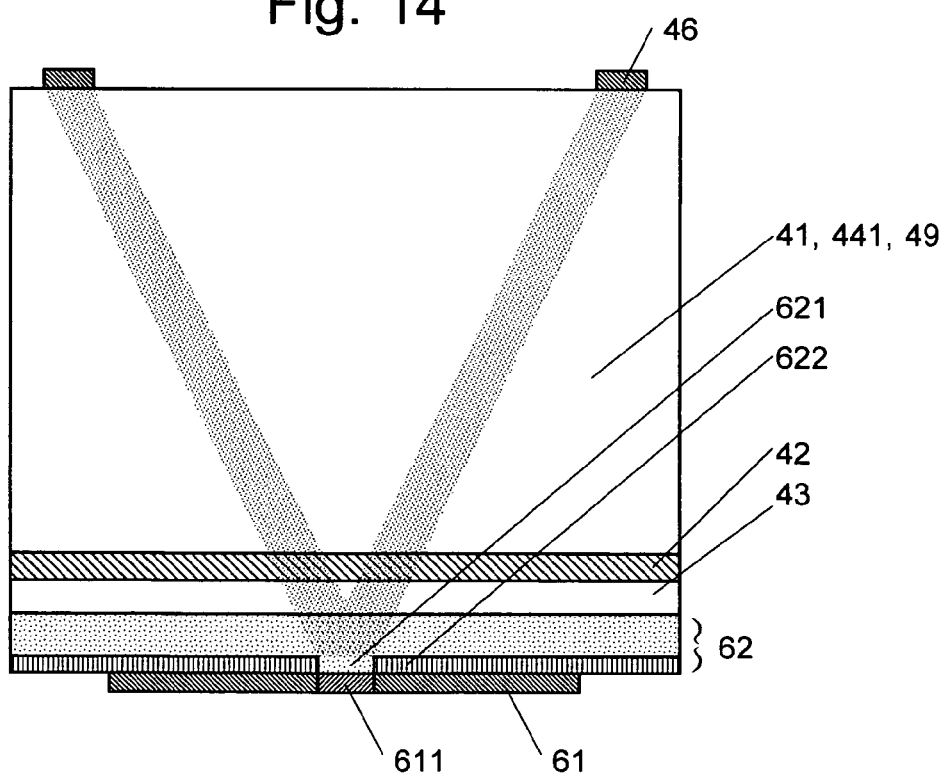
FIG. 14 is a schematic view of a vertical section of the two-dimensional photonic crystal in the third embodiment.

The plate member 61 and the conductive area-limiting layer 62 are described in detail referring to the vertical sectional view shown FIG. 14. In the conductive area-limiting layer 62, the portion close to the lower surface consists of a central conductive area 621 and an insulating area 622 surrounding the conductive area 621. The conductive area 621 is adequately smaller than the window-shaped electrode 46 including the window 461. The plate member 61 is made of a material that is electrically conductive and reflective of light having an objective wavelength. The plate member 61 covers the entirety of the conductive area 621 and a portion of the insulating area 622.

The electric current generated between the plate member 61 and the window-shaped electrode 46 passes only through the central area 611 of the plate member 61 located immediately below the conductive area 621 and then through the conductive area 621. Thus, only the central area 611 of the plate member 61 functions as the mount surface electrode. Since the conductive area 621 is adequately smaller than the window-shaped electrode 46, the electric current is concentrated into a small zone of the active layer.

The entirety of the plate member 61 functions as the reflector. Therefore, the construction of the present surface-emitting laser is simpler than in the case where a reflector is additionally provided. Since the plate member 61 is larger than the central area 611 through which an electric current is injected into the active layer, the reflection area of the member constituting the mount surface electrode is larger than in the case where a small member is used as the mount surface electrode and no reflector is additionally provided.

The invention claimed is:

1. A two-dimensional photonic crystal surface-emitting laser light source, comprising:
   a) a substrate made of a material that is transparent to light having an objective wavelength;
   b) a laser oscillator including an active layer and a two-dimensional photonic crystal, wherein light is generated within the active layer and is amplified in the active layer itself, wherein the wavelength of the light is fixed to the objective wavelength, the two-dimensional photonic crystal including a plate-shaped body material in which a large number of modified refractive index areas whose refractive index differs from that of the body material are periodically arranged, and wherein the laser oscillator is located below the substrate;
   c) a mount layer for mounting the two-dimensional photonic crystal emission laser light source on an external base member, where the mount layer is located below the two-dimensional photonic crystal and the active layer in such a manner where a distance between a lower surface of the mount layer and the active layer is smaller than a distance between an upper surface of the substrate and the active layer;
   d) a window-shaped electrode on the upper surface of the substrate, where the electrode has a window for emitting laser light having the objective wavelength therethrough;
   e) a mount surface electrode located on the lower surface of the mount layer and having an area smaller than that of the window-shaped electrode inclusive of an area of the window; and
   f) a reflector for reflecting the laser light having the objective wavelength, where the reflector is provided below the laser oscillator, wherein:
   a majority of the emitted laser light is emitted through the window-shaped electrode,
   the modified refractive index areas are arranged in a square lattice pattern and have an asymmetrical shape with respect to at least one of axes of the square lattice pattern, and
   the modified refractive index areas have an equilateral-triangular shape.

2. The two-dimensional photonic crystal surface-emitting laser light source according to claim 1, wherein:
   a ratio of an area of the window-shaped electrode including the area of the window to that of the mount surface electrode is within a range from 2:1 to 400:1 and a ratio of the distance between the upper surface of the substrate and the active layer to the distance between the lower surface of the mount surface and the active layer is within a range from 2:1 to 400:1.

3. The two-dimensional photonic crystal surface-emitting laser light source according to claim 1, wherein:
   the reflector is located between the laser oscillator and the mount surface electrode.

4. The two-dimensional photonic crystal surface-emitting laser light source according to claim 1, wherein:
   the active layer is a multi-quantum well of InGaAs/GaAs; and
   the substrate is an n-type GaAs.

5. A two-dimensional photonic crystal surface-emitting laser light source, comprising:
   a) a substrate made of a material that is transparent to light having an objective wavelength;
   b) a laser oscillator including an active layer and a two-dimensional photonic crystal, wherein light is generated within the active layer and is amplified in the active layer itself, wherein the wavelength of the light is fixed to the objective wavelength, the two-dimensional photonic crystal including a plate-shaped body material in which a large number of modified refractive index areas whose refractive index differs from that of the body material are periodically arranged, and wherein the laser oscillator is located below the substrate;
   c) a mount layer for mounting the two-dimensional photonic crystal emission laser light source on an external base member, where the mount layer is located below the two-dimensional photonic crystal and the active layer in such a manner where a distance between a lower surface of the mount layer and the active layer is smaller than a distance between an upper surface of the substrate and the active layer;

d) a window-shaped electrode on the upper surface of the substrate, where the electrode has a window for emitting laser light having the objective wavelength therethrough;

e) a mount surface electrode located on the lower surface of the mount layer and having an area smaller than that of the window-shaped electrode inclusive of an area of the window; and f) a reflector for reflecting the laser light having the objective wavelength, where the reflector is provided below the laser oscillator, wherein:

a majority of the emitted laser light is emitted through the window-shaped electrode;

the mount layer is made of a conductive material, a portion of the lower surface of the mount layer is defined as a conductive area, and an insulating area is created around the conductive area; and the mount surface electrode made of a material reflecting the laser light having the objective wavelength is placed so that it covers the insulating area.

6. The two-dimensional photonic crystal surface-emitting laser light source according to claim 5, wherein:

the insulating area is created by injecting resistance-increasing ions into the mount layer.

7. A two-dimensional photonic crystal surface-emitting laser light source, comprising:

a) a substrate made of a material that is transparent to light having an objective wavelength;

b) a laser oscillator including an active layer and a two-dimensional photonic crystal, wherein light is generated within the active layer and is amplified in the active layer itself, wherein the wavelength of the light is fixed to the objective wavelength, the two-dimensional photonic crystal including a plate-shaped body material in which a large number of modified refractive index areas whose refractive index differs from that of the body material are periodically arranged, and wherein the laser oscillator is located below the substrate;

c) a mount layer for mounting the two-dimensional photonic crystal emission laser light source on an external base member, where the mount layer is located below the two-dimensional photonic crystal and the active layer in such a manner where a distance between a lower surface of the mount layer and the active layer is smaller than a distance between an upper surface of the substrate and the active layer;

d) a window-shaped electrode on the upper surface of the substrate, where the electrode has a window for emitting laser light having the objective wavelength therethrough;

e) a mount surface electrode located on the lower surface of the mount layer and having an area smaller than that of the window-shaped electrode inclusive of an area of the window; and f) a reflector for reflecting the laser light having the objective wavelength, where the reflector is provided below the laser oscillator, wherein:

a majority of the emitted laser light is emitted through the window-shaped electrode, a distance between the laser oscillator and the reflector is set so that a reflected light emitted from the laser oscillator and then reflected by the reflector constructively interferes with a light directly emitted from the laser oscillator to the side on which the window-shaped electrode is located, and the distance between the laser oscillator and the reflector is adjusted by one or more distance-adjusting layers located between the laser oscillator and the reflector.

\* \* \* \* \*